United States Patent
Khanifar et al.

(10) Patent No.: US 6,937,094 B2
(45) Date of Patent: Aug. 30, 2005

(54) SYSTEMS AND METHODS OF DYNAMIC BIAS SWITCHING FOR RADIO FREQUENCY POWER AMPLIFIERS

(75) Inventors: Ahmad Khanifar, Laguna Hills, CA (US); Nikolai Maslennikov, Tustin, CA (US); Mark Gurvich, Costa Mesa, CA (US); Bill Vassilakis, Tustin, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/386,013

(22) Filed: Mar. 11, 2003

(65) Prior Publication Data

US 2004/0100323 A1 May 27, 2004

Related U.S. Application Data

(60) Provisional application No. 60/428,607, filed on Nov. 22, 2002.

(51) Int. Cl.[7] ............................................. H03G 3/20
(52) U.S. Cl. ...................... 330/129; 330/51; 330/151
(58) Field of Search ................... 330/129, 136, 330/256, 285, 151, 297

(56) References Cited

U.S. PATENT DOCUMENTS

| | | | |
|---|---|---|---|
| 4,220,929 A | * 9/1980 | Talbot et al. ............... 330/136 |
| 4,266,204 A | 5/1981 | Jacoby | |
| 4,873,493 A | 10/1989 | Fujiwara | |
| 5,077,539 A | 12/1991 | Howatt | |
| 5,101,173 A | 3/1992 | DiPiazza et al. | |
| 5,155,448 A | 10/1992 | Powell | |
| 5,323,119 A | 6/1994 | Powell et al. | |
| 5,420,536 A | 5/1995 | Faulkner et al. | |
| 5,444,418 A | 8/1995 | Mitzlaff | |
| 5,847,602 A | 12/1998 | Su | |
| 5,898,338 A | 4/1999 | Proctor et al. | |
| 5,923,215 A | * 7/1999 | Hans ............................ 330/149 |
| 5,949,283 A | 9/1999 | Proctor et al. | |
| 5,973,556 A | 10/1999 | Su | |
| 6,028,486 A | * 2/2000 | Andre ........................... 330/297 |
| 6,104,241 A | 8/2000 | Cova et al. | |
| 6,107,880 A | * 8/2000 | Shaw ........................... 330/136 |
| 6,166,601 A | 12/2000 | Shalom et al. | |
| 6,172,560 B1 | 1/2001 | Yamashita et al. | |
| 6,252,455 B1 | 6/2001 | Kurby et al. | |
| 6,294,957 B1 | 9/2001 | Luu | |
| 6,331,801 B1 | 12/2001 | Schmitt et al. | |
| 6,366,177 B1 | 4/2002 | McCune et al. | |
| 6,380,802 B1 | 4/2002 | Pehike et al. | |
| 6,388,514 B1 | 5/2002 | King et al. | |
| 6,396,341 B1 | 5/2002 | Pehlke | |
| 6,404,284 B1 | 6/2002 | Johnson | |
| 6,424,212 B1 | 7/2002 | Brandt | |
| 6,437,641 B1 | 8/2002 | Bar-David | |
| 6,438,360 B1 | 8/2002 | Alberth, Jr. et al. | |
| 6,445,247 B1 | 9/2002 | Walker | |
| 6,445,249 B1 | 9/2002 | Khan et al. | |
| 6,621,350 B2 | * 9/2003 | Verbist et al. ............... 330/297 |
| 6,714,071 B1 | * 3/2004 | Page ........................... 330/136 |

* cited by examiner

Primary Examiner—Henry Choe
(74) Attorney, Agent, or Firm—Paul B. Heynssens; Peter J. Meza; Hogan & Hartson LLP (57) ABSTRACT

A dynamic bias switching circuit is provided that includes a switching unit for switching between a first signal level and a second signal level based on a signal envelope of an input signal to an amplifier.

29 Claims, 8 Drawing Sheets

SYSTEMS AND METHODS OF DYNAMIC BIAS SWITCHING FOR RADIO FREQUENCY POWER AMPLIFIERS

CROSS-REFERENCE TO RELATED APPLICATION

This application claims the benefit of U.S. Provisional Patent Application No. 60/428,607, filed Nov. 22, 2002, the contents of which are hereby incorporated by reference.

BACKGROUND OF THE INVENTION

The present invention relates to power amplifiers, and more particularly to power amplifier systems in which multiple signals are simultaneously transmitted at varying power levels.

In electronic communication systems, it is often necessary that groups of information signals be amplified and transmitted simultaneously. For example, a cellular radio base station transmitter typically transmits signals to many active receiving mobile stations within a single geographic cell. The signals typically appear at multiple predetermined frequencies in such multi-carrier signals. Similarly, a satellite communications transponder amplifies and transmits large number of information signals destined for various participating remote stations. Because such systems customarily employ a frequency division multiple access (FDMA) scheme, in which information signals are modulated on signal carriers occupying several frequency channels within an allocated frequency band, care must be taken to avoid inter-channel interference which may corrupt signal transmissions.

One possible source of such cross-channel interference is known as intermodulation distortion (IMD), which may result when two or more signals of different frequencies are mixed. For example, if two carriers of different frequencies are amplified using a non-linear amplifier, spurious outputs occur at the sum and difference of integer multiples of the original carrier frequencies.

Third order intermodulation products resulting from two relatively strong signals may disrupt transmission of a third relatively weak signal being transmitted on a carrier having a frequency equal to the frequency of the intermodulation product. It is desirable to reduce this distortion.

Base station power amplifier systems exhibiting a high degree of linearity can be desirable since such amplifiers can help minimize the out-of-band emissions and allow for frequency reuse schemes. Amplifier systems are made up of power amplifiers (or "gain blocks") to provide more gain than possible with a single gain block.

Various solutions have been proposed for improving linearity and reducing inter-channel effects in multi-carrier amplifier systems. One such solution is the feed-forward amplifier system. To further improve linearity in a feed forward amplifier system predistorters may be added in front of individual power amplifiers (gain blocks), or the bias applied to gain blocks may be controlled.

In the feed-forward amplifier system two loops can be used to cancel distortion. In a first loop, a portion of the signals at the input to the amplifier are fed forward and, following suitable amplitude and phase adjustment, are subtracted from the amplifier output to generate an error signal. The error signal is proportional to distortion components of the output. The first loop that generates the error signal is known as the signal-cancellation loop. The error signal is then amplified, phase-adjusted and subtracted from the amplifier output to give a corrected signal output with reduced distortion effects. This portion of the circuit is known as the error-cancellation loop.

Nonlinearity can be tolerated in a feed forward amplifier system if the input signal to the amplifier has a constant envelope. However, problems can arise when the input signal has a large peak-to-peak average or signal envelope.

In some recent digital modulation schemes with improved bandwidth efficiency, information is embedded only in a carrier phase. Nevertheless, the input signal is typically characterized by a relatively large amplitude variation or "signal envelope", and on average the signal amplitude remains considerably lower than the frequent signal peaks. To help control amplitude distortion and out of band emissions, it is desirable for power amplifiers to be capable of handling these frequent signal peaks and remain somewhat efficient in their power consumption. A way to boost an amplifier's ability to faithfully reproduce large dynamic range signals and maintain a degree of efficiency is to switch in a greater power supply voltage when it is needed. The power amplifier is required to switch between these peaks. However, in the prior art switch losses tend to negate the benefits of switching.

Conventional approaches have utilized continuous tracking of the signal envelope., However, such approaches can be inefficient and result in significant power losses, particularly when the input signal is characterized by a large average to peak ratio.

Accordingly, there is a need for controlling the bias supply to help reduce intermodulation distortion in a feed forward amplifier system that amplifies input signals that vary considerably in amplitude. It is also desirable to efficiently utilize the power applied to the amplifier such that excessive power is not consumed, and that the amplifier provides a linearity similar to that of an amplifier biased for linear operation. For example, an amplifier that is heavily biased class A or AB.

SUMMARY OF THE INVENTION

An aspect of the present invention provides a method for linear amplification of an envelope of a multicarrier input signal in a power amplifier that includes an amplifier, comprising: determining the RF (Radio Frequency) signal envelope; and switching a power supply input to the amplifier between a first voltage level and a second voltage level based on the RF signal envelope.

Another aspect of the present invention provides a dynamic bias switching circuit, comprising means for switching between a first signal level and a second signal level based on a signal envelope of an input RF signal to an amplifier. For example in an embodiment the first RF signal envelope level is associated with a first power supply level, or first bias level, and the second RF signal envelope level is a second power supply level, or a second bias level.

Another aspect of the present invention provides a dynamic bias switching circuit adapted to provide a first signal level and a second signal level, comprising an input for a multicarrier input signal having a signal envelope; means for determining the signal envelope; and means for switching between the first signal level and the second signal level based on the signal envelope.

Another aspect of the present invention provides a power amplifier, comprising an amplifier that receives a multicarrier input signal; and a dynamic bias switch unit having an input coupled to the amplifier input signal and an output coupled to the amplifier power supply, wherein the dynamic bias switch unit is adapted to switch a power supply level applied to the amplifier between a first power supply level and a second power supply level.

BRIEF DESCRIPTION OF DRAWINGS

The following discussion may be best understood with reference to the various views of the drawings, described in summary below, which form a part of this disclosure.

DETAILED DESCRIPTION

The present invention is now described more fully with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the size of functional units are exaggerated for clarity. Like numbers refer to like elements throughout.

Although the present invention is described and illustrated herein as being implemented in a feed forward power amplifier that is utilized in a cellular telephone system, the system described is provided as an example and not a limitation. As those skilled in the art will appreciate, the present invention is suitable for application in a variety of different types of amplifier systems.

For example an amplifier system having a digital predistortion circuit utilizes the dynamic bias switch. In a digital predistorter system, those skilled in the art will appreciate that the envelope of the input signal is derived by processing the I (image) and Q (quadrature) components of an input signal being digitally processed to produce information on the amplitude and phase of the input signal. For example a power amplifier having a dynamic bias switch and a digital predistorter does not need a signal splitter or coupler to provide a sample of an input signal the the dynamic bias switch. Instead input signal envelope information is fed from the digital predistorter directly to the dynamic bias switch.

In this description the term detector specifically refers to fast detector circuits, such as an "envelope detector". Equivalently any detector having a sufficient response time to track the signal may be used. For example a peak detector having sufficient response time to track an RF envelope may be utilized.

In this description, the terms the "first signal level" and "first voltage" are used interchangeably, and the terms the "second signal level" and "second voltage" are used interchangeably. However, the types of signal levels that may be utilized to accomplish some functions of this invention are not necessarily limited to voltages. For example, current signal levels, power signals levels could also be utilized for similar purposes.

The terms "pass transistor" and "RF transistor" are used in this description, however, these terms are used only for purposes of description and are not intended to be limiting. Rather, the terms "pass transistor" and "RF transistor" are intended to encompass any type of transistor that can accomplish the functions described herein.

The term LDMOS transistor refers to a laterally diffused MOS transistor. However, as will be appreciated by those skilled in the art in equivalent embodiments MOS, or other transistors may be utilized such as FETS, HBETs and bipolars at lower frequencies that have a sufficiently fast turn off time.

The dynamic bias switch tends to improve the efficiency of a power amplifier excited by a multicarrier input signal having a signal envelope in comparison to conventionally constructed power amplifiers. By partitioning a power supply rail, that supplies power to one or more gain blocks, into a first level and a second level, and switching the power supply rail from a first level to a second level via an efficient switch based on the signal envelope of the input signal, increased linearity and efficiency tend to be achieved.

An embodiment of the present invention provides a dynamic bias switching circuit that includes a switching structure for switching between a first signal level and a second signal level based on a signal envelope of an amplifier input signal.

For example, the power supply rail of the amplifier can be partitioned into at least two levels. The rail may be partitioned by providing more than one supply, each set to a different level, or by other means known to those skilled in the art. The power supply can then be switched between these levels such that power is increased or decreased responsive to the signal envelope. Because the input signal applied to a power amplifier typically comprises a large peak-to-average signal, it is desirable to switch to a higher supply only when needed. This switching approach can help avoid energy losses associated with continuous power supply tracking of amplification of the signal envelope. Implementations of the present invention tend to improve RF power amplifier efficiency, when excited by an input signal having a large peak-to-average ratio. Accordingly, the efficiency of power amplifiers excited by an input signal having a large peak-to-average signal can be improved.

Figure 1:
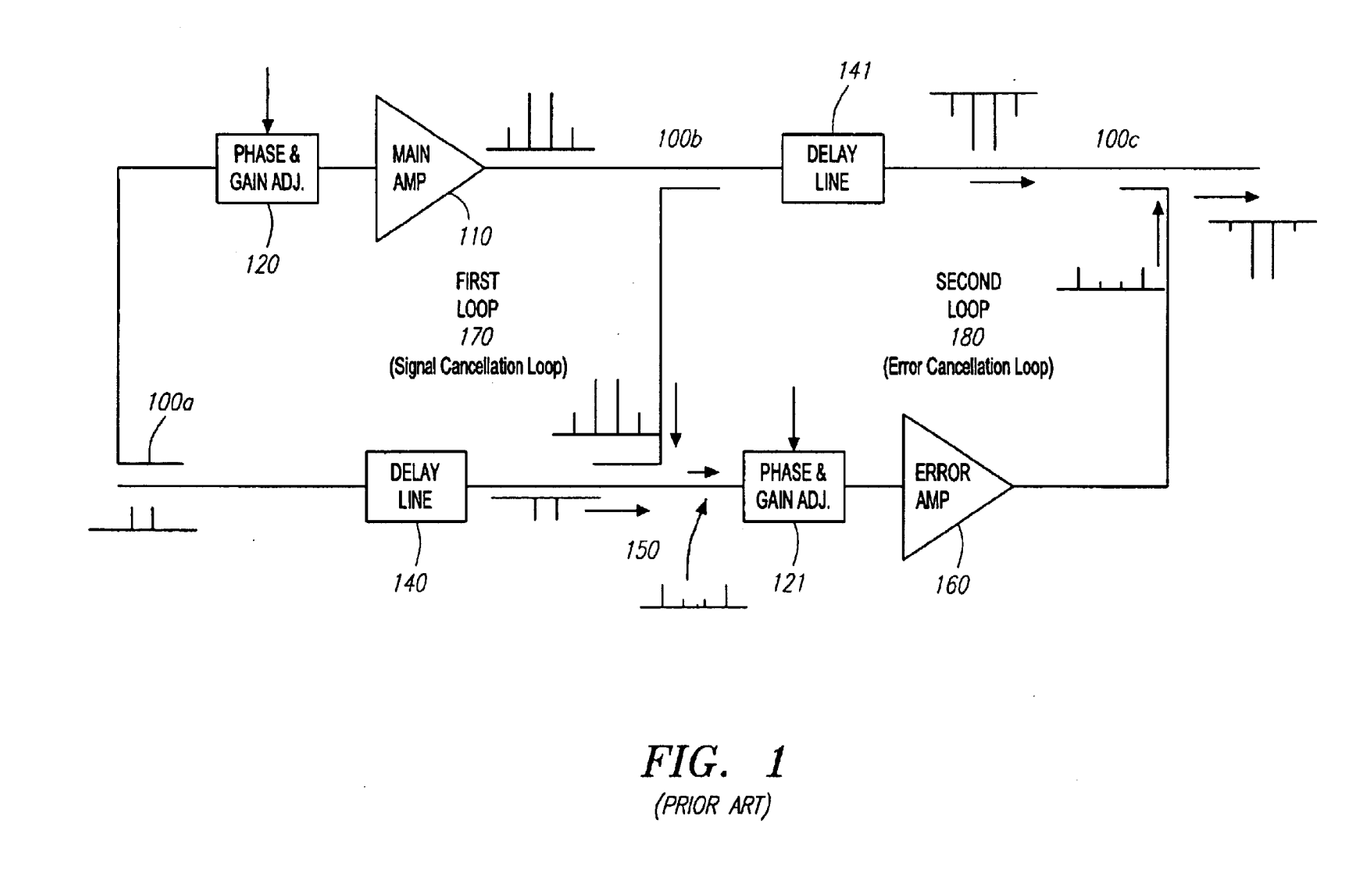
FIG. 1 is a block diagram of a conventional feed-forward amplifier system.

FIG. 1 is a block diagram of a conventional feed-forward linear amplifier system. An input signal is applied to coupler 100a which couples portions of the input signal to delay line 140 and to main amplifier 110. Main amplifier 110 produces an amplified output having intermodulation products generated due to non-linearities in main amplifier 110. The main amplifier tends to produce most of the signal gain and typically consumes considerable DC power. Improving the linearity of the main amplifier and its efficiency is a desirable goal. A portion of the amplified output signal is coupled to summer 150 by coupler 100b. Delay line 140 delays the input signal with respect to the output of the amplifier 110 producing a delayed signal such that the two signals reach summer 150 at approximately the same time, but reversed in phase.

The output of summer 150 is an error signal which is coupled to auxiliary amplifier 160. The error (or Auxiliary) amplifier 160 increases the amplitude of the error signal producing an error correction signal. The error amplifier can consume considerable power and could benefit from increased linearity and efficiency. The error correction signal should be matched in amplitude to the intermodulation products (i.e. spurious component) generated by main amplifier 110 and delay line 141, but reversed in phase. The resultant vector cancellation of the intermodulation products is performed in coupler 10c where the error correction signal is subtracted from the amplified input signal. The vector cancellation must be performed with a high degree of accuracy. If the error correction signal is matched in amplitude and phase to the intermodulation products, the error correction signal can completely cancel the intermodulation products of the main amplifier. However, even with the high-precision components used in the amplifier, the error signal in reality cannot completely cancel the spurious component generated by main amplifier 110. In general, complete cancellation requires that the error correction signal be maintained with greater than 0.5 degrees phase accuracy and 0.1 dB amplitude accuracy which is difficult to achieve in production.

The feed-forward technique can be used in a multi-carrier power amplifier to effectively suppress intermodulation products, but at the cost of lower power efficiency and a high demand on complexity and component cost. Feed forward amplifier systems advantageously utilize techniques such as predistorting the amplifier input signal to improve linearity. Such amplifiers would benefit from additional circuitry to help improve linearity.

Figure 2:
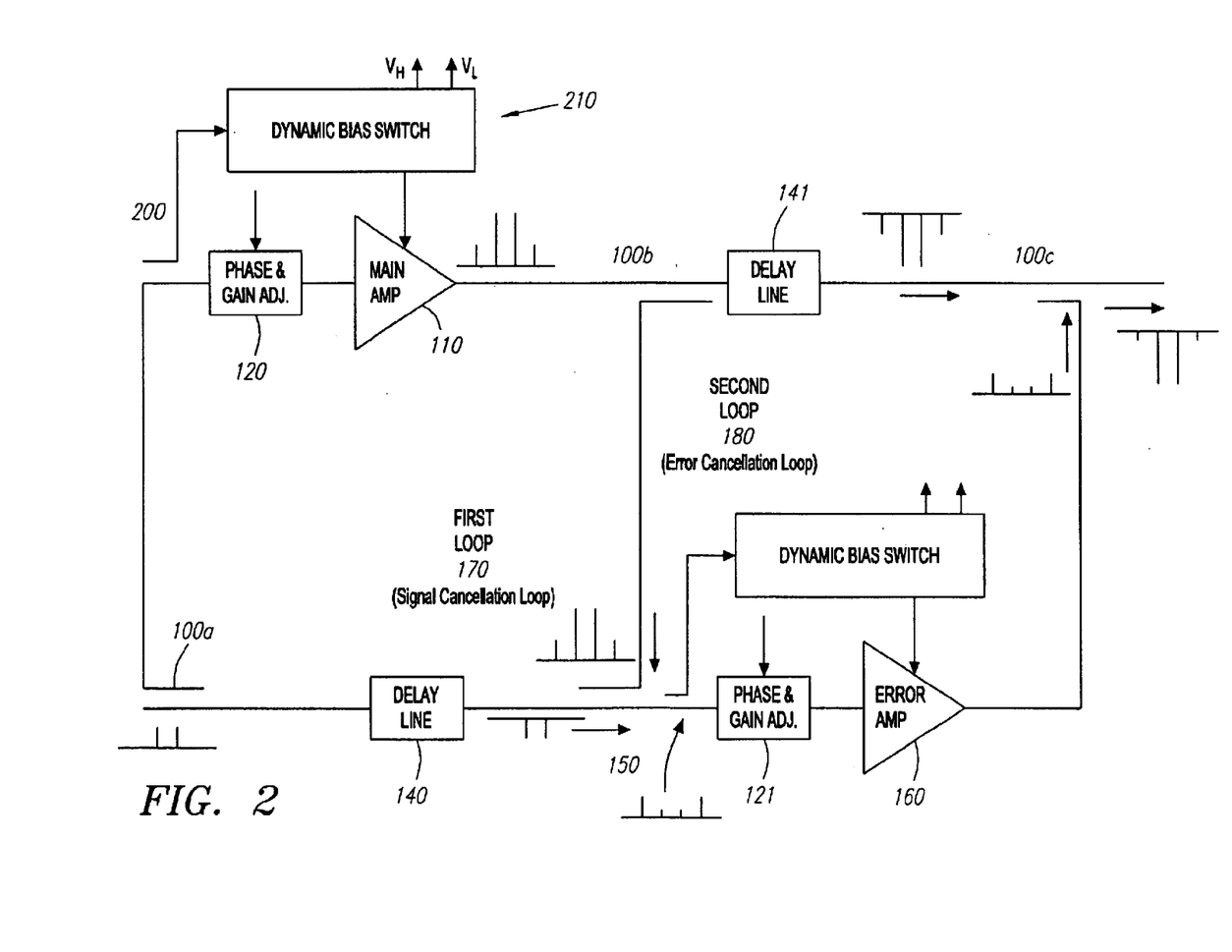
FIG. 2 is a feed-forward power amplifier system having dynamic bias switching.

FIG. 2 is a feed-forward power amplifier system having dynamic bias switching. The feed-forward amplifier is an example of an amplifier system in which the dynamic bias switch may be utilized. For example the dynamic bias switch may also be utilized in a series of cascaded amplifiers such that the overall distortion of the cascade tends to be reduced. The connections here are similar to those previously shown except for the added switch. The connection of the previously described elements will not be repeated.

In the figure, a dynamic bias switch unit 210 is added at both the main amplifier 110 and the error amplifier 160. Alternative embodiments dynamic bias switching may be added to only one amplifier. The input signal from coupler 100a to main amplifier 110 is coupled to the dynamic bias switch 210 via coupler 200. The input signal typically comprises multicarrier input signal having a signal envelope with a large peak-to-average ratio.

The dynamic bias switch unit 210 generates an output coupled to the main amplifier power supply. The dynamic bias switch unit is adapted to switch between power supply levels that are applied to the main amplifier from a first power supply level ($V_L$) and a second power supply level ($V_H$) when the peak value of an amplifier input signal exceeds a predetermined value.

By alternating between the first power supply level and the second power supply level, large dynamic range input signals that benefit from a high supply voltage are amplified with improved linearity, and amplifier efficiency is improved since a higher voltage is applied on demand. This can also reduce intermodulation products generated due to continuously switching the power supplied to the main amplifier 110.

Figure 3:
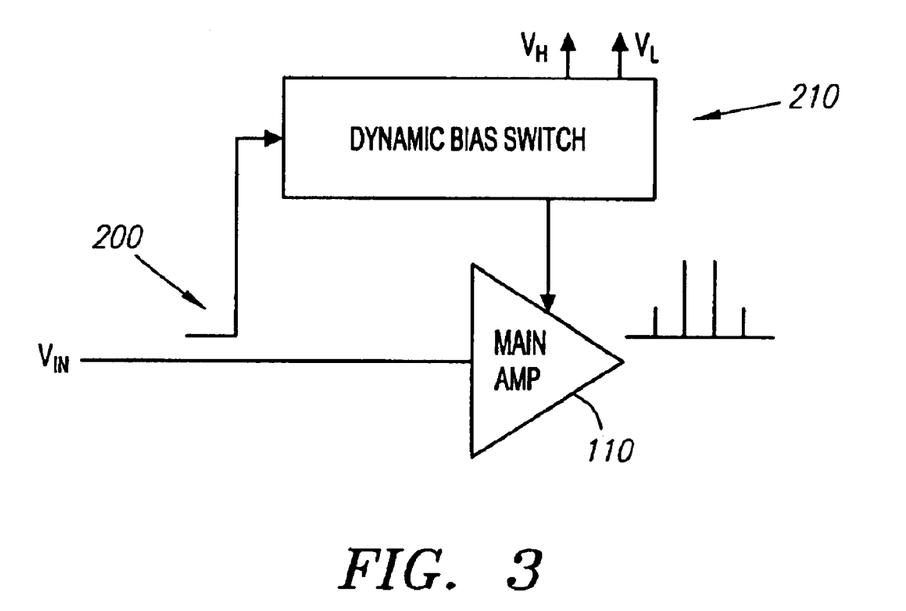
FIG. 3 illustrates a block diagram of an amplifier from the feed-forward power amplifier system having a dynamic bias switch.

FIG. 3 illustrates a block diagram of an amplifier from the feed-forward power amplifier system (or gain block) having a dynamic bias switch unit 210 at the main amplifier 110. The amplifier may be a main amplifier 110 or an error amplifier 160. As will be appreciated by those skilled in the art, amplifiers 110 and 160 may each be made up of multiple amplifier stages. The input signal from coupler 200 to main amplifier 110 is coupled to the dynamic bias switch 210 via coupler 200. Coupler 200 is a conventionally constructed coupler, known to those skilled in the art, for sampling an input signal. The input signal typically comprises multicarrier input signal having a signal envelope with a large peak-to-average ratio.

The dynamic bias switch unit 210 generates an output coupled to the amplifier 110 power supply. The dynamic bias switch unit is configured to switch the power supply level applied to the amplifier between a first power supply level ($V_T$) and a second power supply level ($V_L$). Alternating between the first power supply level and the second power supply level improves amplifier efficiency so that a high supply voltage is amplified only when needed, and allows large dynamic range input signals to be amplified with improved linearity.

As noted above, switching between supplies can also reduce intermodulation products generated over that of the method of continuously varying the power supplied to the amplifier 110, that would be used in a system that attempts to track the envelop of an RF input signal.

Figure 4:
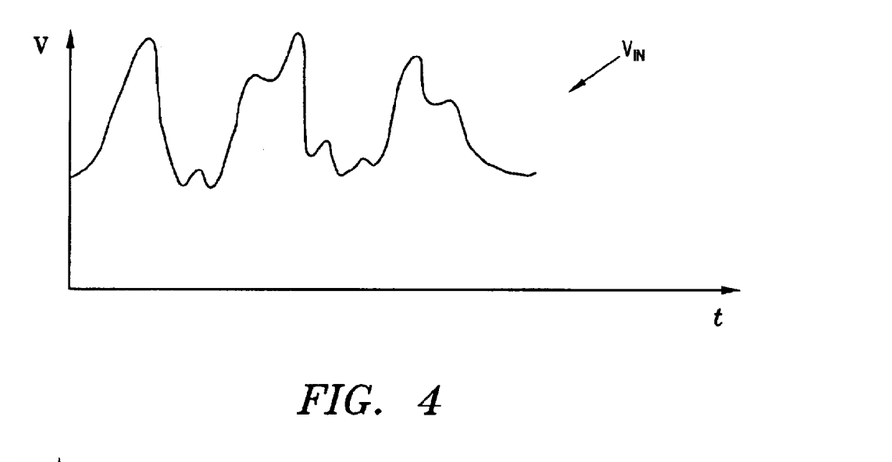
FIG. 4 is a time domain graph of an envelope of an RF signal level that is applied to the amplifier.

FIG. 4 is a time domain graph of an RF signal level that is applied to the main amplifier, and a portion of which is coupled to the dynamic bias unit by coupler 200. As shown, the input signal typically will have a large peak-to-peak average ratio. A Wide Band CDMA (WB-CDMA) signal would be one example of such an input signal. The dynamic bias switch analyzes the signal envelope of this input signal to determine when a high voltage power supply needs to be applied in order to sufficiently amplify the portion of the signal with a high peak value.

High peak value signals typically cause distortion in a power amplifier. When an amplifier is called upon to amplify large valued signals the resulting amplifier would be large, costly and consume large amounts of power. A solution would be to use an amplifier designed to amplify the signal level that is encountered most of the time with sufficient linearity, and provide a way of boosting the power handling capabilities of the amplifier when an exceptionally strong signal is encountered.

One way to increase power handling is to attempt to track the power supply needs of the amplifier after it is determined that added power handling is needed, so that just enough power is supplied to maintain linearity and efficiency.

Another way is to determine when increased power in the amplifier is needed, and switch the amplifier to the single higher supply only when needed, thus keeping amplifier efficiency up.

Figure 5:
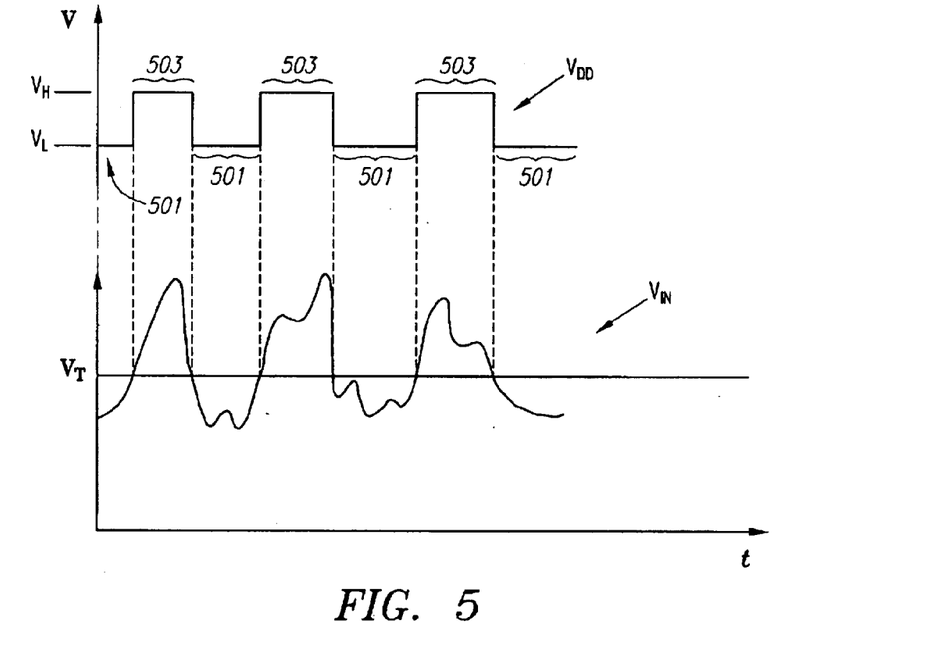
FIG. 5 is a time domain graph showing how the dynamic bias switch switches the amplifier to a higher supply voltage ($V_H$) from a lower supply voltage ($V_L$) when a threshold voltage ($V_T$) has been exceeded by the RF input signal ($V_{IN}$) applied to the input of the dynamic bias switch.

FIG. 5 is a time domain graph showing how the dynamic bias switch switches the amplifier to a higher supply voltage ($V_H$) from a lower supply voltage ($V_L$) when a threshold voltage ($V_T$) has been exceeded by the RF input signal ($V_{IN}$) applied to the input of the dynamic bias switch. As shown, the dynamic bias switch switches between the first power supply level ($V_L$) and the second power supply level ($V_H$) when the signal envelope of the input signal $V_{IN}$ exceeds a preset threshold. Specifically, the dynamic bias switch switches between a lower voltage ($V_L$) and a higher voltage ($V_H$) in response to portions of the RF input signal $V_{IN}$ that exceed the lower threshold ($V_T$) to produce the curve $V_{DD}$.

In conventional high power amplification techniques, a lower supply voltage was provided to the amplifier until the peak of the RF input signal exceeded a preset threshold, and then a higher amplifier bias voltage was applied that tracked the signal envelope. The supply voltage was made to track the signal envelope above the threshold to supply just enough current to maintain linearity while keeping power consumption down. However, this approach would typically utilize a continuous voltage controlled current source. The voltage controlled current source, would typically dissipate large amounts of power in it's operation. For this stage of operation, amplification would be linear, but inefficient.

By contrast, embodiments of the present invention switch to the higher supply voltage with a low power consumption pass-transistor switch when the signal envelope of the RF input signal, that is detected by an envelope detector, exceeds a preset threshold. This tends to be beneficial because a switch tends to dissipate less power than a voltage controlled current source. Thus, even though the amplifier is continuously running at a higher current, the overall efficiency is better than that obtained by attempting to cut back amplifier power with an element that has its own considerable power loss.

As shown, for input signal levels $V_{IN}$ falling below the first signal level ($V_T$) are sufficiently amplified for a first percentage of time at first amplifier supply voltage ($V_L$). During this first percentage of time 501 an output waveform from the amplifier biased with $V_L$ is free from clipping.

An amplifier operating under bias of $V_L$ and having an input level $V_{IN}$ above first signal level ($V_T$) has insufficient linearity for a second percentage of time 503 during which $V_{IN}$ extends above the threshold line $V_T$. The second percentage of time 503 is generally statistically less than the first percentage of time 501. Because the second percentage of time 503 is statistically less than the first percentage of time the first signal level is typically adequate to operate the power amplifier and therefore power losses can be reduced and the efficiency of the amplifier can be improved.

To simplify this description, a first signal level $V_L$ and a second signal level $V_H$ will be described to illustrate the basic function of the bias switching circuit in response to the input signal $V_{IN}$. In the time intervals designated 501, the RF input to the amplifier has an envelope describing the peak values of the RF waveform that fall below the voltage level of $V_T$. During time interval 501, the bias switch connects the amplifier to the bias supply $V_H$. The level $V_T$ is selected as will be appreciated by those skilled in the art so that the amplifier will produce an output signal having sufficient linearity for the intended use until $V_T$ is exceeded.

During the second time interval 503, the envelope of the input signal $V_{IN}$ exceeds $V_T$, as shown in the figure. Rather than having the amplifier bias track $V_{IN}$ during this portion of time, the bias to the amplifier is switched to a higher level $V_H$. The amplifier bias $V_{DD}$ remains at the $V_H$ until the envelope of $V_{IN}$ falls below $V_T$. When $V_{IN}$ falls below $V_T$ the bias switch switches the amplifier power supply back to $V_L$.

It should be appreciated that these events occur at high speeds. Those skilled in the art will realize that high speed components having high switching speeds, fast settling time, and low delays are called for in order to implement the bias switch at high frequencies However, one of ordinary skill in the art will appreciate that the switching circuit 220 could be adapted to switch between a plurality of signal levels in a similar manner. For example, the switching circuit 220 could be adapted to switch between a first signal level, a second signal level, and a third signal level based on the signal envelope. The switching circuit 220 could be adapted to switch between any number of signal levels that would allow switching that improves amplifier efficiency and provide improved linearity while using a switch instead of a voltage controlled current source.

Figure 6:
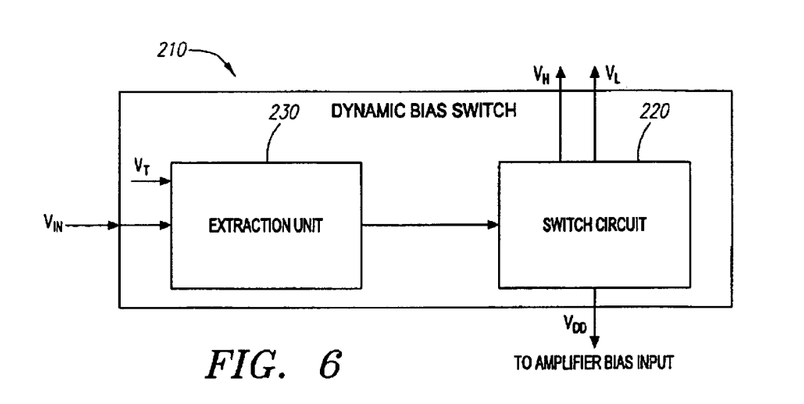
FIG. 6 is a block diagram of an embodiment of a dynamic bias switch.

FIG. 6 is a block diagram of an embodiment of a dynamic bias switch. As shown, the dynamic bias switch unit 210 includes an extraction unit 230 for determining the signal envelope, and a switching circuit 220 for switching between the first power supply level $V_H$ and the second power supply level $V_L$ based upon the input signal level.

A sample of the amplifier input signal $V_{IN}$ is coupled to the input of the extraction unit 230. An output of the extraction unit 230 is coupled to the input of the switch circuit 220. The output of the switch circuit 220 is coupled to the power supply input of the amplifier or gain block (not shown). The switch circuit 220 includes a first and second power supply input $V_H$ and $V_L$, respectively. As discussed above, the switching circuit 220 can switch between the first power supply level and the second power supply level when the signal envelope exceeds a preset threshold $V_T$, that is provided by a reference level internal to the extraction unit.

The dynamic bias switch may be constructed on a common circuit board with the gain block disposed at a remote location. Alternatively, the dynamic bias switch may be constructed as a discreet or integrated circuit disposed on a substrate such as silicon, by methods known to those skilled in the art.

Figure 7:
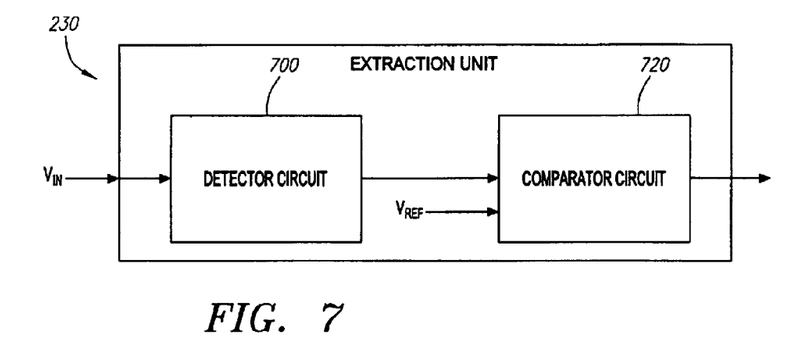
FIG. 7 is a block diagram of an embodiment of the extraction unit of the dynamic bias switch.

FIG. 7 is a block diagram of an embodiment of the extraction unit of the dynamic bias switch. The extraction unit includes a detector circuit 700 and a comparator circuit 720. A sample of the amplifier input signal is coupled to the input of the detector 700. The detector 700 is constructed in a manner known to those skilled in the art to extract the envelope from a sample of the multicarrier input signal $V_{IN}$.

The comparator circuit 720 has a first input responsive to an output of the detector and a second input responsive to a reference input signal. An output of the detector 700 is coupled to the first input of comparator circuit 720. The comparator circuit 720 generates an output by comparing the output of the detector 700 with the reference input signal. The output of the comparator circuit 720 is coupled to the switch control unit 800 shown in FIG. 8 (not shown). The comparator circuit is constructed utilizing methods known to those skilled in the art to produce a fast responding circuit with fast settling time. In an embodiment, an evelope detector is used with a comparator. In a further alternative embodiment, a very fast peak detector is used.

Figure 8:
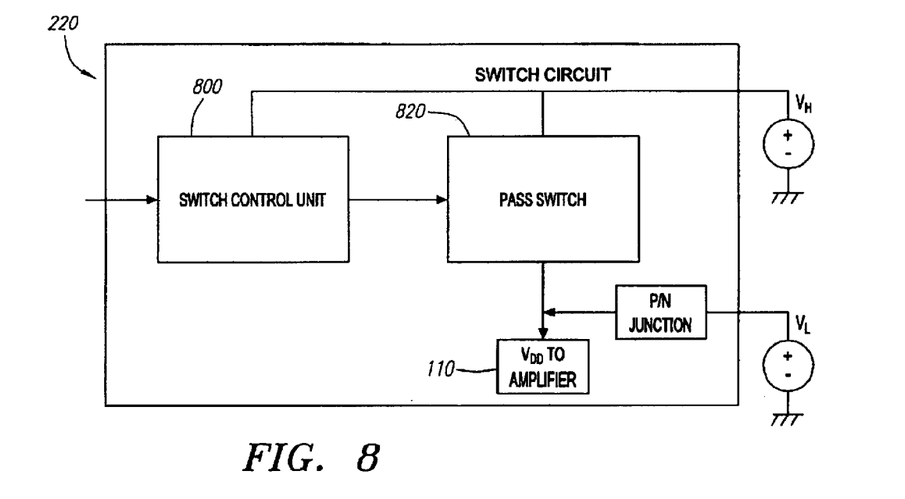
FIG. 8 is a block diagram of an embodiment of the switch block of the dynamic bias switch.

FIG. 8 is a block diagram of an embodiment of the switch circuit of the dynamic bias switch. The switch circuit 220 includes a switch control unit 800 and a pass switch 820. The output of the comparator circuit is coupled to the input of the switch control unit 800. The switch control unit 800 is coupled to and responsive to an output of the extraction unit (230 of FIG. 7), and generates an output drive sufficient for controlling selection of one of the first power supply levels, or the second power supply level. An output of the switch control unit 800 is coupled to the input of the pass switch 820. The pass switch 820 is responsive to the output of the switch control unit.

The pass switch 820 switches between power supplies and generates an output comprising, for example, the first power supply level or the second power supply level, depending upon whether the signal envelope exceeds a preset threshold. The output of the pass switch 820 is coupled to the power supply input of the amplifier (not shown).

Figure 9:
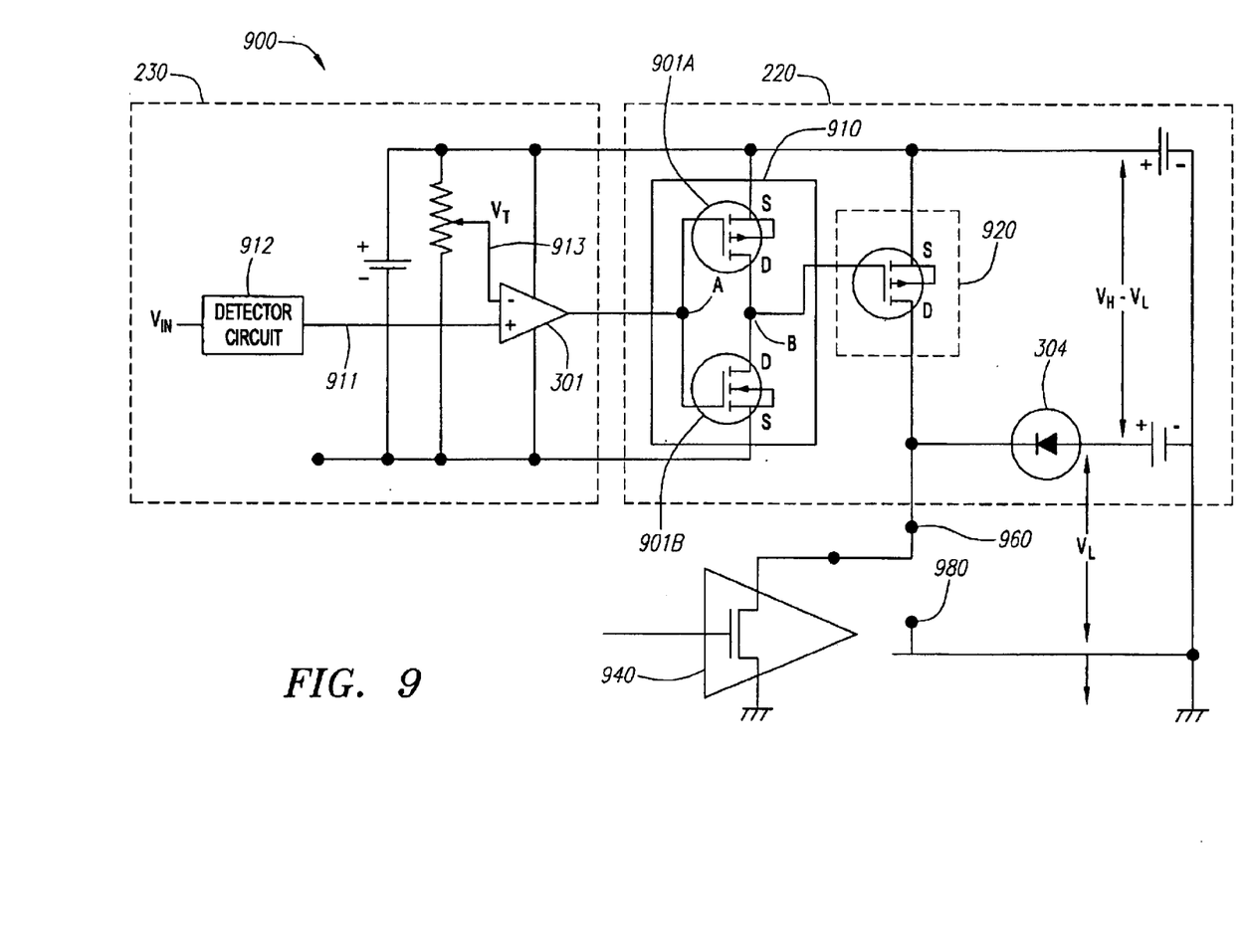
FIG. 9 is a schematic of an embodiment of the dynamic bias switch.

FIG. 9 is a schematic of an embodiment of the dynamic bias switch. A dynamic bias switching circuit 900 includes a multicarrier signal input $V_{IN}$, an extraction unit 230, and a switching circuit 220, as coupled and discussed above.

The extraction unit 230 determines the signal envelope. In the embodiment shown, the extraction unit 230 may be implemented using a detector 912 to generate an envelope signal and a comparator circuit 301. Alternatively, the detector circuit 912 may be eliminated, as will be appreciated by those skilled in the art, if the input characteristic of comparator 301 will allow direct envelope detection.

The detector 912 can be an envelope detector that is appropriate for use in high frequency amplification applications. The frequency of envelope change in RF base-station applications is in the order of tens of megahertz. Other types of detectors, such as a fast peak detector could also be utilized so long as the detector is compatible with switching at the megahertz range.

The output of the detector 912 is applied to a positive input terminal 911 of a comparator circuit. A d-c reference input VT, that may be changed with the potentiometer that is supplied with a stable reference voltage, is applied to another input 913 of the comparator 301. The comparator 301 can then be used to generate an output by comparing the output of the detector 912 with a DC reference input signal.

The comparator circuit is designed by methods known to those skilled in the art to have very large voltage gain. The comparator 301 can be implemented, in an embodiment, using a fast operational amplifier 301 connected in an open loop configuration. The operational amplifier can have a first output voltage based on a first input voltage level and a second output voltage based on a second input voltage level. The dual positive and negative supply voltages required to drive the operational amplifier 301 are taken from $V_T$ and $V_H$, or the separated sources.

The comparator output of the extraction unit 230 is coupled to the input of the buffer switch (or switch control unit 800 as shown in FIG. 8) 910 of the switch circuit 220. The switch unit 220 may be implemented, for example, using a buffer switch 910 as the switch control unit (800 of FIG. 8) and a pass transistor 920 as the pass switch (820 of FIG. 8). The buffer switch 910 enables fast switching of pass-transistor 920 at speeds that are required to match the envelope signal excursions above $V_T$.

Those skilled in the art will appreciate that the gate of transistor 920 posesses an inherent capacitance that tends to limit the switching speed of the transistor 920. Those skilled in the art will appreciate that in order for a voltage sufficient to switch the transistor with little loss to be reached, that the capacitor must be fully charged quickly. A charging capacitor does not reach the voltage applied to it until sufficient charge (supplied by a current) has been supplied. The larger the capacitance that may be required, the larger the amount of current that is needed for fast switching. If the transistor does not switch fast then the channel will be resistive, and thus lossy, for an interval in time causing power loss. Thus, a high current buffer that supplies a large amount of charge to the pass transistor gate tends to switch the transistor quickly between completely on and off states. Quick switching reduces power dissipation in the pass transistor since the channel of the pass transistor does not remain long in a lossy state.

The buffer switch 910 may be implemented via a push-pull circuit or in an alternative embodiment as a single ended buffer circuit. However, a single ended circuit tends to have increased loss due to the continuous presence of a biasing resistor in the source connection. This resistance and its power dissipation tends to be eliminated by the dynamic load resistance of a complementary push pull pair. For example in a single ended circuit a biasing resistor would be utilized in the source or drain lead. Such a resistor would always dissipate power. By utilizing a complementary transistor the biasing resistor is not needed, as will be appreciated by those skilled in the art.

In one embodiment, the push-pull circuit comprises a pair of complementary transistors (shown in block 910). The source terminal S of the first transistor 901A is coupled to the positive supply voltage, and the source terminal S of the second transistor 901B is coupled to the negative supply voltage. The gates of each transistor 901A, 901B are coupled together and to node A which is coupled to the output of a comparator 301. The drain terminals D of each transistor 901A, 901B are coupled together at node B which produces a voltage that drives the gate of pass transistor 920.

As noted above, the frequency of envelope change in RF base-station applications is in the order of tens of megahertz. As such, faster switching MOS devices, such as complementary MOSFET devices used in the buffer switch 910 can allow for large current switching at the megahertz range, are utilized.

The output of the complementary-pair of MOSFET transistors toggles between the first signal level (shown here as a voltage level, $V_T$) and the second signal level (shown here as a voltage level, $V_H$) and turns the pass transistor 920 into 'ON' or 'OFF' states accordingly. As such, the switching circuit 220 can generate an output that includes, for example, one of the first signal level ($V_L$) and the second signal level ($V_H$).

The first signal level can be, for example, a discrete signal level ($V_L$) generated by a diode circuit 304 when the pass transistor 920 is in an OFF state. The second signal level ($V_H$), can be, for example, a discrete signal level ($V_H$) when the pass transistor 920 is in an ON state.

In one embodiment, a source of pass transistor 920 is coupled to the positive supply voltage and the drain of pass transistor 920 is coupled to node 960. The pass transistor 920 is preferably configured such that when the input signal envelope level exceeds a preset threshold, the pass transistor is switched to the second signal level ($V_H$) when the signal envelope exceeds the preset threshold. This places the pass transistor 920 in an ON state. In the ON state the pass transistor is switched fully on, with little channel resistance in the current path. Thus, little power is dissipated in the pass transistor. The bias voltage used to switch the pass transistor 920 to the second OFF state tends to be preferably less than approximately one volt. For example, in a p or n channel MOSFET, the bias voltage to switch the transistor fully 'ON' has to be greater than 5 volts. In this mode of operation, the transistor channel resistance is in the order of few hundredths of an ohm. Thus, the pass transistor 920 can be operated as a switch with extremely low channel (Ohmic) resistance in the path of the current through the pass transistor. This tends to provide a switching mode that can minimize power losses.

A drain and source of an RF transistor 940 of the amplifier (not shown) is typically placed across terminals 960 and 980 by which two levels of $V_{DD}$ can be applied to the RF transistor. The pass transistor 920 can be used to control current between the power supply and a drain of the RF transistor 940. The RF transistor 940 may comprise, for example, high power transistors, such as, FETs or bipolar devices.

One of two possible drain supply voltages, the first signal level ($V_L$) and the second signal level ($V_H$), can be utilized. By switching the drain voltage of the pass transistor 920 to the second signal level ($V_H$), the transistor 920 is placed in an ON state when the signal envelope exceeds the preset threshold ($V_T$). The second signal level ($V_H$) can thus be applied to a drain of the RF transistor 940 when the signal envelope exceeds the preset threshold ($V_L$).

The improvement in efficiency of an amplifier implementing the dynamic bias switch unit 900 results since the product of current and the voltage across the active device (e.g., the amplifier) which constitutes the energy lost in the active device has been reduced. The pass transistor 920, which is controlled by the input excitation, is in 'ON' state only if the drain voltage $V_{DD}$ across the RF transistor is insufficient to satisfy the swing of the input voltage. Therefore, for most of the time, the lower supply voltage is used and the energy loss is minimized. The pass transistor 920 therefore serves as a switch as opposed to a continuous voltage-controlled-current-source. The pass transistor 920 can thus allow the higher supply voltage rail to be applied to the drain of the RF transistor (not shown) with negligible losses. The low power dissipation of the switching-mode of the pass transistor is thus used to reduce the losses and to improve the efficiency further.

The amplification of a Wide Band CDMA (WB-CDMA) signal is a typical application. Inspection of the Complementary Cumulative Distribution Function (CCDF) of such a signal shows that for a considerable percentage of time, the lower supply ($V_L$) rail is sufficient to operate the amplifier and the output waveform will not be clipped. The drain voltage ($V_{DD}$) is switched to a higher supply voltage through switching circuitry when the envelope of the input signal exceeds a preset threshold. Over the short interval where high voltage ($V_H$) is required, the pass transistor 920 can be switched fully 'ON' and there is a very little channel resistance (Ohmic resistance) in the path of the current through the pass transistor 920. As a result, power losses are minimized. Utilizing a switching mode that avoids power losses can be beneficial to overall amplifier efficiency.

Figure 10:
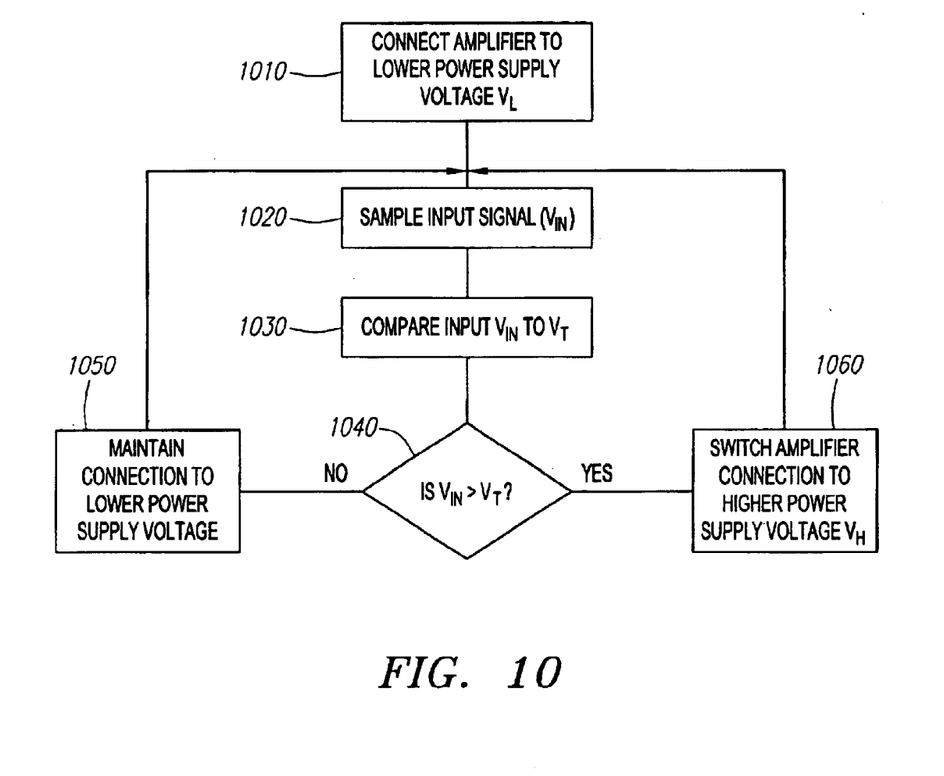
FIG. 10 is a flow diagram showing a method for linear amplification of a multicarrier signal in a feed-forward power amplifier system, by switching between amplifier power supplies based upon input signal level.

FIG. 10 is a flow diagram showing a method for linear amplification of a multicarrier signal in a feed-forward power amplifier system, by switching between amplifier power supplies based upon input signal level.

At Block 1010, the power amplifier is connected to the lower voltage power supply. At Blocks 1020, the input signal envelope of $V_{IN}$ is sampled. At Block 1030, the sample of the envelope of $V_{IN}$ is compared with a reference signal. At Block 1040, it is determined if the signal envelope exceeds a preset threshold $V_T$. Block 1060, the connection of If the signal envelope does not exceed the preset threshold $V_T$, then at Block 1050, the connection of the power amplifier to the lower voltage power supply is maintained. If the signal envelope exceeds a preset threshold $V_T$, then at the power amplifier is switched to the higher voltage power supply. Thus, the power supply input to the amplifier is switched between a first signal level and a second signal level, that is greater than the first signal level, if the signal envelope exceeds a preset threshold to thereby track variations of the envelope signal.

Figure 11:
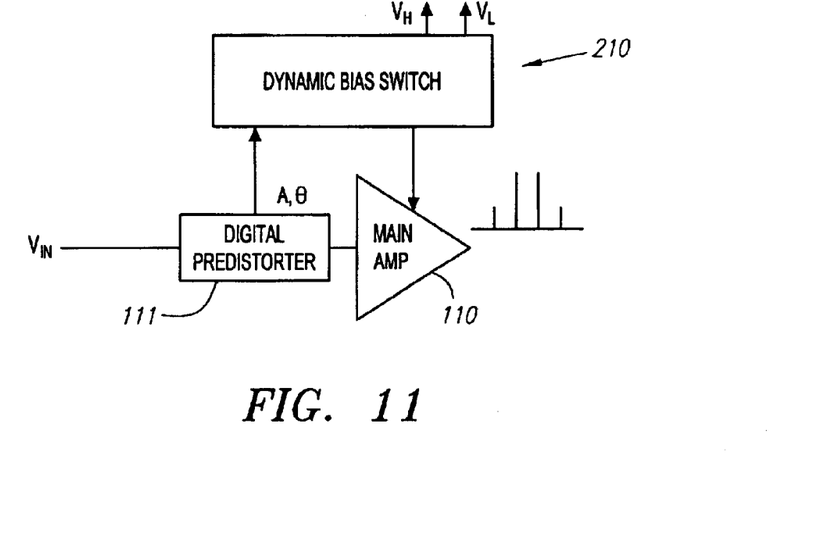
FIG. 11 illustrates a block diagram of an amplifier and digital predistorter combination including a dynamic bias switch.

FIG. 11 illustrates a block diagram of an amplifier and digital predistorter combination including a dynamic bias switch. The dynamic bias switch is connected as described above with respect to the main amplifier 110. In this embodiment, however, a predistorter 111 is disposed before the main amplifier 110. The input signal is received directly by predistorter 111. The input signal typically comprises multicarrier input signal having a signal envelope with a large peak-to-average ratio.

The predistorter then processes the input signal to generate an I (in-phase) and Q (quadrature) vector with information about the Cartesian coordinates that describe the input signal. These Cartesian coordinates can be converted into polar coordinates specifying amplitude information and phase information. This information can then be used by the dynamic bias switch 210 to generate $V_H$ and $V_L$, and by amplifier 110. The predistorter is a conventionally constructed predistorter, constructed utilizing techniques known to those skilled in the art. Equivalently, other distortion reducing circuits and methods may be used in conjunction with the dynamic bias switch to reduce the overall amplifier system distortion.

Figure 12:
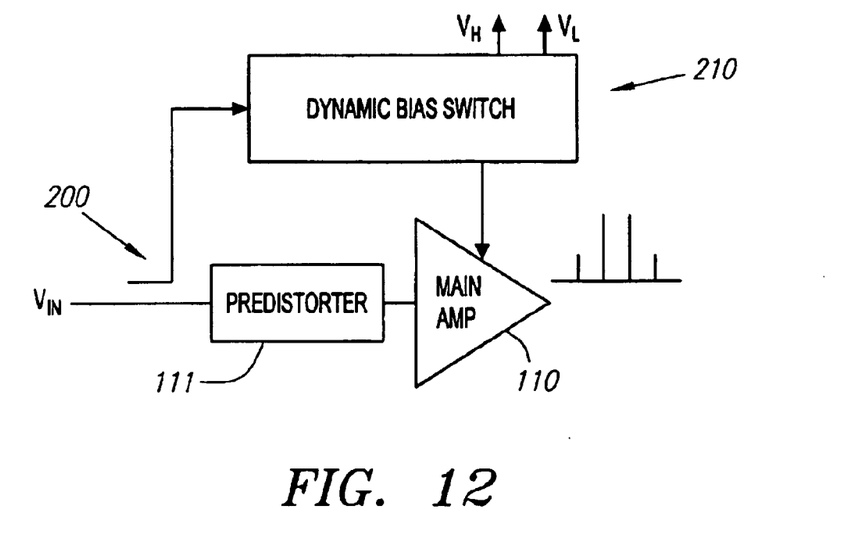
FIG. 12 illustrates a block diagram of an amplifier and predistorter combination including a dynamic bias switch.

In FIG. 12, the input signal from coupler 200 to main amplifier 110 is coupled to the dynamic bias switch 210 via coupler 200. The predistorter utilized in this embodiment is a conventionally constructed analog predistorter, constructed utilizing methods known to their skilled in the art. Likewise, sampling circuit 200 shown as a directional coupler, may be equivalently constructed utilizing methods known to those skilled in the art to sample the desired signals.

Figure 13:
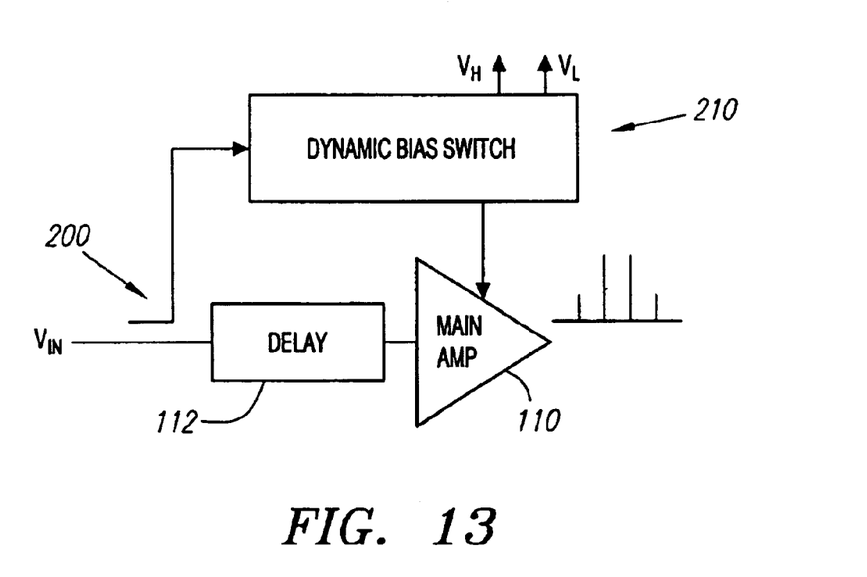
FIG. 13 illustrates a block diagram of an amplifier including a dynamic bias switch with a delay element disposed in front of the amplifier.

FIG. 13 illustrates a block diagram of an amplifier including a dynamic bias switch with a delay circuit disposed in front of the amplifier. The dynamic bias switch is connected as described above with respect to the amplifier 110. In this embodiment, however, a delay circuit 112 is disposed before the amplifier 110 and after the sampling circuit 200, such that the input signal is delayed before being coupled to the amplifier 110. The delay circuit 112 tends to compensate for time delays introduced by the dynamic bias switch 210.

To synchronize the amplitude modulations and correct reconstruction of the original input signal, the delay between the amplifier input to output path and the sampling circuit to the output of the dynamic bias switch should be equalized as much as possible. Introducing the dynamic bias switch unit can cause the time delay in the RF phase path to be substantially shorter than that of the low frequency amplitude information.

The shorter wavelengths associated with high frequencies, such as RF frequencies, allow a delay circuit to be practical. At low frequencies, such as audio frequencies, a delay circuit would be too large.

This mismatch in time delay can cause increased distortion to appear at the output of the main amplifier. The intermodulation distortion (IMD) introduced by delay mismatch is given by:

$$\Delta_{IMD} \approx 2\pi (B^2_{RF})(\Delta\tau^2)$$

where $B_{RF}$ is the signal bandwidth and $\Delta\tau$ is the delay mismatch. Thus, to reduce the distortion it is expedient to reduce the time delay to zero by equalizing the path lengths.

The delay circuit 112 provides time delay equalization to help reduce IMD. The delay circuit 112 may be implemented, for example, by a low-loss coaxial cable (delay line) or any other slow wave structure of suitable electrical length.

In alternate embodiments of amplifier systems that implement the dynamic bias switch unit, multiple stages of amplification are disposed between the sampling circuit 200 and the amplifier that is controlled by the dynamic bias switch 200. These multiple stages of amplification provide additional drive for the final amplifier which is controlled by the dynamic bias switch. The RF input sampling that provides the envelope information is taken at the input of the amplifier before the driver stages and other passive and active circuits. The delay in driver (RF) amplifier chain will aid the time alignment between the slower-path of envelope-triggered switching action and the RF signal in the power stages. One or more additional delay lines will compensate the differential delay that remains.

While aspects of the present invention have been described in terms of certain preferred embodiments, those of ordinary skill in the will appreciate that certain variations, extensions and modifications may be made without varying from the basic teachings of the present invention. For example, although the dynamic bias switch has been described with respect to the application to amplifiers, those skilled in the art will realize that it may also be applied to other types of non-linear circuits that would benefit from power supply switching to improve their linearity and reduce distortion. As such, aspects of the present invention are not to be limited to the specific preferred embodiments described herein. Rather, the scope of the present invention is to be determined from the claims, which follow.

What is claimed is:

1. A dynamic bias switching circuit adapted to provide a first power supply level and a second power supply level, comprising:
    an input signal having a signal envelope;
    a detector adapted to extract the envelope from a sample of the multicarrier input signal;
    a comparator circuit having a first input responsive to an output of the detector and a second input responsive to a reference input signal, wherein the comparator circuit generates an output by comparing, the output of the detector with the reference input signal, the comparator circuit comprising an operational amplifier having a first output voltage based on a first input voltage level and a second output voltage based on a second input voltage level; and
    means for switching between the first power supply level and the second power supply level based on the signal envelope.

2. A dynamic bias switching circuit according to claim 1, wherein the means for switching switches to the second power supply level when the signal envelope exceeds a threshold.

3. A dynamic bias switching circuit according to claim 1, wherein the means for switching between a first power supply level and a second power supply level based on the signal envelope, comprises:
    a switch unit that generates an output comprising one of the first power supply level and the second power supply level.

4. A dynamic bias switching circuit according to claim 3, wherein the switch unit comprises:
    a buffer switch; and
    a first transistor coupled to a buffer output,
    wherein the buffer switch enables switching of the first transistor to allow for tracking of variations of the envelope signal.

5. A dynamic bias switching circuit according to claim 4, wherein the buffer switch comprises:
    a complementary pair of transistors, wherein a gate of each of the pair of transistors is connected to the an output of a comparator circuit.

6. A dynamic bias switching circuit according to claim 4, wherein the first power supply level is a discrete signal level ($V_L$) generated by a diode circuit that places the first transistor in an ON state.

7. A dynamic bias switching circuit according to claim 4, wherein the second power supply level is a discrete signal level ($V_H$) that places the first transistor in an OFF state.

8. A dynamic bias switching circuit according to claim 1 wherein the second power supply level is greater than the first power supply level.

9. A dynamic bias switching circuit according to claim 1, wherein the first power supply level is sufficient to operate the power amplifier for a first percentage of time.

10. A dynamic bias switching circuit according to claim 9, wherein the first power supply level is insufficient to operate the power amplifier for a second percentage of time that is statistically less than the first percentage of time.

11. A dynamic bias switching circuit according to claim 9, wherein during the first percentage of time an output waveform of the dynamic bias switching circuit is free from clipping.

12. A dynamic bias switching circuit according to claim 4, further comprising:
    an second transistor,
    wherein the first transistor controls current between the power supply and a drain of the second transistor.

13. A dynamic bias switching circuit according to claim 12, wherein a bias voltage of the first transistor is less than a preset threshold, and
    wherein a drain voltage of the first transistor is switched to the second signal level to place the first transistor in an ON state and allow the second signal level to be applied to a drain of the second transistor when the signal envelope exceeds the preset threshold.

14. A power amplifier, comprising:
    an amplifier that receives a multicarrier input signal; and
    a dynamic bias switch unit having an input coupled to the amplifier input signal and an output coupled to the amplifier power supply, wherein the dynamic bias switch unit is adapted to switch a power supply level applied to the amplifier between a first power supply level and a second power supply level, wherein the dynamic bias switch unit comprises:
    means for coupling a multicarrier input signal having a signal envelope;
    means for determining the signal envelope; and
    a buffer switch and a first transistor that generates an output for controlling selection of one of the first cower supply level and the second power supply level, wherein the buffer switch enables switching of the first transistor to allow for tracking of variations of the envelope signal.

15. A dynamic bias switching circuit according to claim 14, wherein the buffer switch and first transistor switches to the second power supply level when the signal envelope exceeds a preset threshold.

16. A dynamic bias switching circuit according to claim 14, wherein the means for determining the signal envelope, comprises:
a detector adapted to extract the envelope from a sample of the multicarrier input signal; and
a comparator circuit having a first input responsive to an output of the detector and a second input responsive to a reference input signal, wherein the comparator circuit generates an output by comparing the output of the detector with the reference input signal.

17. A dynamic bias switching circuit according to claim 16, wherein the comparator circuit comprises:
an operational amplifier having a first output voltage based on a first input voltage level and a second output voltage based on a second input voltage level.

18. A dynamic bias switching circuit according to claim 14, wherein the buffer switch comprises:
a complementary pair of transistors, wherein a drain of each of the pair of transistors is connected to the gate of the first transistor.

19. A dynamic bias switching circuit adapted to provide a first power supply level and a second power supply level, comprising:
an input signal having a signal envelope;
means for determining the signal envelope; and
a buffer switch and a first transistor coupled to a buffer output that generates an output comprising one of the first power supply level and the second power supply level based on the signal envelope, wherein the buffer switch enables switching of the first transistor to allow for tracking of variations of the envelope signal.

20. A dynamic bias switching circuit according to claim 19, wherein the buffer switch provides a control signal to the first transistor to switch to the second power supply level when the signal envelope exceeds a threshold.

21. A dynamic bias switching circuit according to claim 19, wherein the means for determining the signal envelope, comprises:
a detector adapted to extract the envelope from a sample of the multicarrier input signal; and
a comparator circuit having a first input responsive to an output of the detector and a second input responsive to a reference input signal, wherein the comparator circuit generates an output by comparing the output of the detector with the reference input signal.

22. A dynamic bias switching circuit according to claim 21, wherein the comparator circuit comprises:
an operational amplifier having a first output voltage based on a first input voltage level and a second output voltage based on a second input voltage level.

23. A dynamic bias switching circuit according to claim 19, wherein the buffer switch comprises:
a complementary pair of transistors, wherein a gate of each of the pair of transistors is connected to the an output of a comparator circuit.

24. A dynamic bias switching circuit according to claim 19 wherein the first power supply level is a discrete signal level (VL) generated by a diode circuit that places the first transistor in an ON state.

25. A dynamic bias switching circuit according to claim 19, wherein the second power supply level is a discrete signal level (VH) that places the first transistor in an OFF state.

26. A dynamic bias switching circuit according to claim 19, wherein the second power supply level is greater than the first power supply level.

27. A dynamic bias switching circuit according to claim 19, wherein the first power supply level is sufficient to operate the power amplifier for a first percentage of time.

28. A dynamic bias switching circuit according to claim 27, wherein the first power supply level is insufficient to operate the power amplifier for a second percentage of time that is statistically less than the first percentage of time.

29. A dynamic bias switching circuit according to claim 27, wherein during the first percentage of time an output waveform of the dynamic bias switching circuit is free from clipping.

* * * * *

UNITED STATES PATENT AND TRADEMARK OFFICE
CERTIFICATE OF CORRECTION

PATENT NO. : 6,937,094 B2  
DATED : August 30, 2005  
INVENTOR(S) : Khanifar et al.

Page 1 of 1

It is certified that error appears in the above-identified patent and that said Letters Patent is hereby corrected as shown below:

<u>Column 14,</u>  
Line 11, delete -- an --.  
Line 12, "a" should be -- the --.  
Line 60, "cower" should be -- power --.

Signed and Sealed this

Seventh Day of March, 2006

JON W. DUDAS  
*Director of the United States Patent and Trademark Office*